(12) United States Patent
Sohn et al.

(10) Patent No.: US 12,174,737 B2
(45) Date of Patent: Dec. 24, 2024

(54) METHOD FOR PROCESSING MEMORY DEVICE

(71) Applicant: ESSENCORE LIMITED, Wanchai (HK)

(72) Inventors: Chan Ho Sohn, Seoul (KR); Ting Lun Ou, Taipei (TW); Kwang Soo Moon, Seoul (KR)

(73) Assignee: ESSENCORE LIMITED, Wanchai (HK)

( * ) Notice: Subject to any disclaimer, the term of this patent is extended or adjusted under 35 U.S.C. 154(b) by 0 days.

(21) Appl. No.: 18/603,932

(22) Filed: Mar. 13, 2024

(65) Prior Publication Data
US 2024/0338313 A1 Oct. 10, 2024

(30) Foreign Application Priority Data
Apr. 10, 2023 (KR) .......................... 10-2023-0047093

(51) Int. Cl.
*H10B 41/00* (2023.01)
*G06F 12/02* (2006.01)
(Continued)

(52) U.S. Cl.
CPC .......... *G06F 12/0246* (2013.01); *H01L 24/42* (2013.01); *H10B 41/00* (2023.02); *H01L 22/22* (2013.01); *H01L 23/49811* (2013.01); *H01L 2224/42* (2013.01); *H01L 2224/48155* (2013.01); *H01L 2224/48225* (2013.01); *H01L 2224/484* (2013.01); *H01L 2224/85* (2013.01); *H05K 2203/049* (2013.01)

(58) Field of Classification Search
CPC .......................... H01L 23/49811–49816; H01L 2224/48155–48165; H01L 2224/48225–4824; H01L 2224/8585–8589; H01L 2224/4891; H01L 24/42; H01L 2224/85–85986; H01L 2224/42–49505; H01L 2224/484–48499; H05K 2203/049
See application file for complete search history.

(56) References Cited

U.S. PATENT DOCUMENTS 5,986,335 A * 11/1999 Amagai .................. H01L 24/32
  257/668
6,927,096 B2 * 8/2005 Shimanuki ........ H01L 23/49548
  438/113
(Continued)

FOREIGN PATENT DOCUMENTS

WO WO-2017023060 A1 * 2/2017 ............. H01L 23/04

*Primary Examiner* — Maliheh Malek
(74) *Attorney, Agent, or Firm* — Bridgeway IP Law Group, PLLC; Sang Ho Lee; Hyun Woo Shin

(57) ABSTRACT

Provided is a method of processing a NAND flash memory device including at least one NAND flash memory and a memory controller configured to control the at least one NAND flash memory. The method includes etching a portion of a first substrate of the NAND flash memory device to expose a wire connecting the at least one NAND flash memory and the memory controller to each other, dividing the wire into a first wire and a second wire by etching a first area of the etched first substrate, and connecting, to a second substrate, the first wire to which the at least one NAND flash memory is connected.

12 Claims, 11 Drawing Sheets

(51) Int. Cl.
  *H01L 23/00* (2006.01)
  *H01L 23/498* (2006.01)
  *H01L 21/66* (2006.01)

(56) References Cited

U.S. PATENT DOCUMENTS

| | | | | |
|---|---|---|---|---|
| 8,304,293 B2* | 11/2012 | Railkar | ............ | H01L 23/49575 |
| | | | | 438/122 |
| 10,613,767 B2* | 4/2020 | Kwon | ............ | G06F 3/064 |
| 10,747,434 B2* | 8/2020 | Ou | ............ | G06F 3/0659 |
| 10,950,593 B2* | 3/2021 | Chang Chien | ............ | H01L 24/73 |
| 11,557,548 B2* | 1/2023 | Cadag | ............ | H01L 21/565 |
| 2007/0085199 A1* | 4/2007 | Ong | ............ | H01L 23/49582 |
| | | | | 257/E23.037 |
| 2007/0158829 A1* | 7/2007 | Hsu | ............ | H01L 23/13 |
| | | | | 257/E23.06 |
| 2008/0001266 A1* | 1/2008 | Yu | ............ | H01L 23/3121 |
| | | | | 257/E21.705 |
| 2009/0230534 A1* | 9/2009 | Okada | ............ | H01L 25/18 |
| | | | | 257/690 |
| 2010/0224970 A1* | 9/2010 | Powell | ............ | H01L 23/49582 |
| | | | | 257/676 |
| 2010/0270659 A1* | 10/2010 | Matsumoto | ............ | H01L 23/3121 |
| | | | | 438/692 |
| 2011/0133309 A1* | 6/2011 | Kuroda | ............ | G11C 5/02 |
| | | | | 257/E23.141 |
| 2011/0304015 A1* | 12/2011 | Kim | ............ | H01L 25/0657 |
| | | | | 257/532 |
| 2012/0203954 A1* | 8/2012 | Sun | ............ | H01L 25/0657 |
| | | | | 711/E12.008 |
| 2012/0241922 A1* | 9/2012 | Pagaila | ............ | H01L 21/4832 |
| | | | | 257/659 |
| 2013/0241041 A1* | 9/2013 | Yu | ............ | H01L 21/4832 |
| | | | | 257/676 |
| 2014/0038323 A1* | 2/2014 | Tsang | ............ | H01L 33/52 |
| | | | | 438/26 |
| 2015/0069632 A1* | 3/2015 | Ozawa | ............ | H01L 23/49838 |
| | | | | 257/777 |
| 2016/0027992 A1* | 1/2016 | Lo | ............ | G01L 19/0069 |
| | | | | 438/51 |
| 2016/0141233 A1* | 5/2016 | Liang | ............ | H01L 24/97 |
| | | | | 257/676 |
| 2016/0216728 A1* | 7/2016 | Happoya | ............ | H05K 3/4602 |
| 2016/0254214 A1* | 9/2016 | Makino | ............ | H01L 23/49582 |
| | | | | 257/676 |
| 2016/0276562 A1* | 9/2016 | Yoneda | ............ | H01L 33/62 |
| 2017/0110383 A1* | 4/2017 | Huang | ............ | H01L 23/3135 |
| 2018/0090468 A1* | 3/2018 | Glennan | ............ | H01L 24/48 |
| 2019/0164909 A1* | 5/2019 | Chang Chien | ............ | H01L 24/19 |
| 2019/0273067 A1* | 9/2019 | Xu | ............ | H01L 23/00 |
| 2019/0354293 A1* | 11/2019 | Kwon | ............ | G06F 3/0679 |
| 2019/0361604 A1* | 11/2019 | Ou | ............ | G06F 3/0605 |
| 2019/0361823 A1* | 11/2019 | Kwon | ............ | G06F 13/1689 |
| 2019/0384096 A1* | 12/2019 | Que | ............ | G02F 1/133514 |
| 2020/0066621 A1* | 2/2020 | Liu | ............ | H01L 23/5386 |
| 2021/0183773 A1* | 6/2021 | Rubin | ............ | H01L 24/17 |
| 2021/0288034 A1* | 9/2021 | Kim | ............ | H01L 24/20 |
| 2021/0358888 A1* | 11/2021 | Boo | ............ | H01L 23/49811 |
| 2022/0068887 A1* | 3/2022 | Chung | ............ | H01L 25/50 |
| 2022/0285316 A1* | 9/2022 | Yuan | ............ | H01L 25/0652 |
| 2022/0336417 A1* | 10/2022 | Chong | ............ | H01L 23/5386 |
| 2022/0359469 A1* | 11/2022 | Chung | ............ | H01L 25/50 |
| 2022/0406724 A1* | 12/2022 | Ji | ............ | H01L 23/49811 |
| 2023/0009643 A1* | 1/2023 | Paek | ............ | H01L 24/24 |
| 2023/0170312 A1* | 6/2023 | Liu | ............ | H01L 23/16 |
| 2023/0260975 A1* | 8/2023 | Tan | ............ | H01L 24/48 |
| | | | | 257/686 |
| 2023/0282559 A1* | 9/2023 | Ng | ............ | H01L 23/50 |
| | | | | 257/734 |
| 2023/0282588 A1* | 9/2023 | Boo | ............ | H01L 24/48 |
| | | | | 257/690 |
| 2023/0411340 A1* | 12/2023 | Yu | ............ | G11C 5/063 |
| 2024/0038720 A1* | 2/2024 | Um | ............ | H10B 80/00 |
| 2024/0178212 A1* | 5/2024 | Muramatsu | ......... | H01L 25/0657 |

* cited by examiner

METHOD FOR PROCESSING MEMORY DEVICE

CROSS-REFERENCE TO RELATED APPLICATION

This application claims priority under 35 U.S.C. § 119 to Korean Patent Application No. 10-2023-0047093, filed on Apr. 10, 2023, in the Korean Intellectual Property Office, the disclosure of which is incorporated by reference herein in its entirety.

BACKGROUND

1. Field

The disclosure relates to a method of processing a memory device. Particularly, the disclosure relates to a method of reusing NAND flash memory by processing a NAND flash memory device that includes NAND flash memory and a memory controller configured to control the NAND flash memory.

2. Description of the Related Art

Semiconductor memory devices used to store data are implemented using semiconductors such as silicon, germanium, and gallium arsenide. In general, semiconductor memory devices are classified into a volatile type and a nonvolatile type.

Data stored in volatile memory devices is erased when power is cut off. Examples of volatile memory devices include static random-access memory (SRAM), dynamic random-access memory (DRAM), and synchronous DRAM (SDRAM). Examples of nonvolatile memory devices include read-only memory (ROM), programmable ROM (PROM), electrically programmable ROM (EPROM), and flash memory. Among such memory devices, flash memory devices are largely classified into a NOR type and a NAND type.

In addition, managed NAND refers to a memory device in which NAND flash memory and a memory controller for controlling the NAND flash memory are packaged. In general, when some elements of managed NAND are defective, the entire managed NAND is discarded. However, this is economically inefficient and has a negative effect on the environment.

SUMMARY

Additional aspects will be set forth in part in the description which follows and, in part, will be apparent from the description, or may be learned by practice of the presented embodiments of the disclosure.

Provided is a method of processing a NAND flash memory device including at least one NAND flash memory and a memory controller configured to control the at least one NAND flash memory. The method may include etching a portion of a first substrate of the NAND flash memory device to expose a wire connecting the at least one NAND flash memory and the memory controller to each other The method may include dividing the wire into a first wire and a second wire by etching a first area of the etched first substrate. The method may include connecting, to a second substrate, the first wire to which the at least one NAND flash memory is connected.

Provided is a method of processing a NAND flash memory device including a first substrate, at least one NAND flash memory, and a memory controller configured to control the at least one NAND flash memory The method may include removing a connection between the at least one NAND flash memory and the memory controller. The method may include connecting the at least one NAND flash memory to a second substrate that is different from the first substrate.

BRIEF DESCRIPTION OF THE DRAWINGS

The above and other aspects, features, and advantages of certain embodiments of the disclosure will be more apparent from the following description taken in conjunction with the accompanying drawings.

The disclosure may be easily understood by combination of the following description and the accompanying drawings in which reference numerals refer to structural elements.

DETAILED DESCRIPTION

Figure 1:
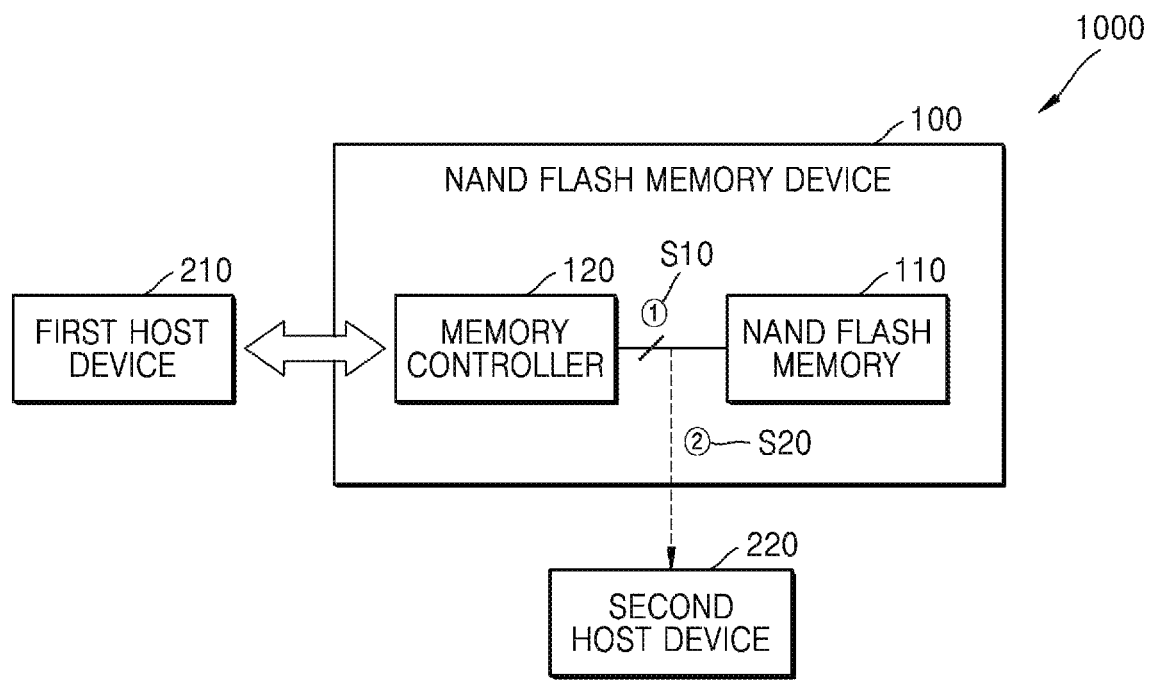
FIG. 1 is a view illustrating an inactive memory system according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

In the disclosure, the expression "at least one of a, b, or c" may indicate "a," "b," "c," "a and b," "a and c," "b and c," "all of a, b, and c," or variations thereof.

The terms used in the disclosure are general terms currently widely used in the art in consideration of functions regarding the disclosure, but the terms may vary according to the intention of those of ordinary skill in the art, precedents, or new technology in the art. Also, some terms may be arbitrarily selected by the applicant, and in this case, the meaning of the selected terms will be described in the detailed description of the disclosure. Thus, the terms used herein should not be construed based on only the names of the terms but should be construed based on the meaning of the terms together with the description throughout the disclosure.

As used herein, singular forms may include plural forms as well unless the context clearly indicates otherwise. Unless defined otherwise, all terms used herein, including technical and scientific terms, may have the same meaning as those commonly understood by a person skilled in the art to which the disclosure pertains. In addition, although terms such as "first" and "second" are used to describe various elements, these elements should not be limited by these terms. These terms are only used to distinguish one element from another element.

It will be further understood that the terms "comprises" and/or "comprising" used herein specify the presence of stated features or elements, but do not preclude the presence or addition of one or more other features or elements. In the disclosure, terms such as "unit" or "module" may be used to denote a unit that has at least one function or operation and may be implemented with hardware, software, or a combination of hardware and software.

Hereinafter, embodiments will be described with reference to the accompanying drawings so that those of ordinary skill in the art may easily implement the idea of the disclosure. However, the disclosure may be implemented in various different forms and is not limited to the embodiments described herein. In the accompanying drawings, portions not related to the embodiments are omitted for clarity of description, and like reference numerals denote like elements throughout. In addition, reference numerals used in each drawing are only for illustrating the drawings, and different reference numerals used in different drawings do not necessarily refer to different elements. Hereinafter, the disclosure will be described with reference to the accompanying drawings.

FIG. 1 is a view illustrating an inactive memory system 1000 according to an embodiment.

Referring to FIG. 1, the inactive memory system 1000 may include a NAND flash memory device 100 and a second host device 220. For reference, FIG. 1 illustrates a first host device 210 together with the inactive memory system 1000 because the first host device 210 is used in an intermediate operation of a method according to an embodiment. However, after all operations of the method of the embodiment are performed, the inactive memory system 1000 includes the NAND flash memory device 100 and the second host device 220.

In an embodiment, the NAND flash memory device 100 may include a NAND flash memory 110 and a memory controller 120.

Although FIG. 1 illustrates that the NAND flash memory device 100 includes one NAND flash memory, the NAND flash memory device 100 may include a plurality of NAND flash memories. The plurality of NAND flash memories may be stacked in the NAND flash memory device 100.

The NAND flash memory 110 may store data. The NAND flash memory 110 may operate in response to control by the memory controller 120. The NAND flash memory 110 may include a memory cell array (not shown) including a plurality of memory cells that store data.

Each of the memory cells may include a single level cell (SLC) capable of storing one data bit, a multi-level cell (MLC) capable of storing two data bits, a triple level cell (TLC) capable of storing three data bits, or a quad level cell (QLC) capable of storing four data bits.

The memory cell array (not shown) may include a plurality of memory blocks. Each of the memory blocks may include a plurality of memory cells. Each of the memory blocks may include multiple pages. In an embodiment, the term "page" may refer to a unit for storing data in the NAND flash memory 110 or reading data stored in the NAND flash memory 110. The term "memory block" may refer to a unit for erasing data.

The NAND flash memory 110 may receive commands and addresses from the memory controller 120 and access areas of the memory cell array that are selected by the addresses. The NAND flash memory 110 may perform an operation instructed by a command on an area selected by an address. For example, the NAND flash memory 110 may perform a write operation (program operation), a read operation, and an erase operation. During a program operation, the NAND flash memory 110 may program data in an area selected by an address. During a read operation, the NAND flash memory 110 may read data from an area selected by an address. During an erase operation, the NAND flash memory 110 may erase data stored in an area selected by an address.

The memory controller 120 may be connected to the first host device 210 and the NAND flash memory 110. The memory controller 120 may access the NAND flash memory 110 in response to a request from the first host device 210. For example, the memory controller 120 may control read, write, and erase operations of the NAND flash memory 110. The memory controller 120 may provide an interface between the NAND flash memory 110 and the first host device 210. The memory controller 120 may drive firmware for controlling the NAND flash memory 110.

For example, the memory controller 120 may include a processor, a NAND controller, and a host interface.

The processor of the memory controller 120 may control the overall operation of the inactive memory system 1000 including the memory controller 120. The processor may operate according to predetermined firmware. For example, the processor may transmit control commands to control the NAND flash memory 110 by controlling the NAND controller, data to be written to memory cell transistors of the NAND flash memory 110, and data to be read from the memory cell transistors of the NAND flash memory 110.

The host interface of the memory controller 120 may provide a communication function between the NAND flash memory device 100 and an external host. In an embodiment, the host interface of the memory controller 120 may provide a communication function between the NAND flash memory device 100 and the first host device 210. When the processor receives a control command from the first host device 210 through the host interface, the processor may control the NAND flash memory device 100 in response to the control command.

A method of processing a NAND flash memory device according to an embodiment may be performed as follows. In operation S10, connection between the NAND flash memory 110 and the memory controller 120 may be removed.

In an embodiment, the NAND flash memory 110 and the memory controller 120 may be connected through a wire. The connection between the NAND flash memory 110 and the memory controller 120 may be removed by cutting the wire connecting the NAND flash memory 110 and the memory controller 120 to each other.

In operation S20, the NAND flash memory 110 may be connected to the second host device 220.

In an embodiment, the NAND flash memory device 100 in which the connection to the memory controller 120 is removed may be stacked on a new substrate. A portion of the cut wire connected to the NAND flash memory 110 may be connected to the new substrate. For example, an end of the cut wire may be connected to the new substrate using another wire.

In an embodiment, the NAND flash memory 110 connected to the new substrate may be connected to the second host device 220. For example, the NAND flash memory 110 may be electrically connected to the second host device 220 through a wire, a metal layer in the new substrate, and solder balls.

A method of removing the connection between the NAND flash memory 110 and the memory controller 120 and creating a connection between the NAND flash memory 110 and the second host device 220 is described below with reference to FIGS. 4 to 7.

Figure 2:
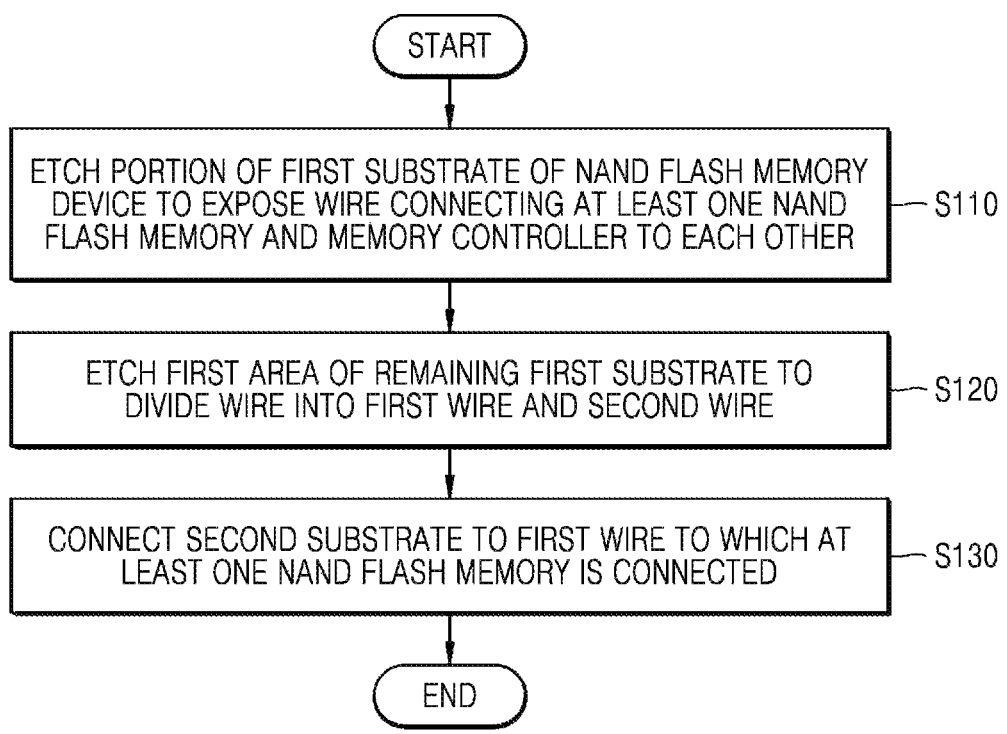
FIG. 2 is a flowchart illustrating operations of processing a NAND flash memory device according to an embodiment.

FIG. 2 is a flowchart illustrating operations of processing a NAND flash memory device according to an embodiment.

Referring to FIG. 2, in operation S110 of a method according to an embodiment, a portion of a first substrate of a NAND flash memory device may be etched to expose a wire connecting at least one NAND flash memory to a memory controller.

In an embodiment, the NAND flash memory device may include the at least one NAND flash memory and the memory controller. The NAND flash memory device may include the first substrate, the at least one NAND flash memory and the memory controller that are arranged on the first substrate, the wire connecting the at least one NAND flash memory and the memory controller to each other, and a molding layer covering the at least one NAND flash memory and the memory controller that are arranged on the first substrate.

The at least one NAND flash memory and the memory controller may be connected through the wire. The wire connecting the at least one NAND flash memory and the memory controller to each other may be disposed in the molding layer and the first substrate. The wire may not be exposed on surfaces of the molding layer and the first substrate.

In an embodiment, a portion (connection portion) of the wire may be disposed in the first substrate. The method of the embodiment may include etching a portion of the first substrate of the NAND flash memory device to expose a portion of the wire disposed in the first substrate.

For example, a portion of the first substrate may be etched by a surface polishing method. However, this is only an example, and the technical idea of the disclosure does not limit the etching method.

In operation S120 of the method of the embodiment, a first area in a remaining area of the first substrate may be etched to divide the wire into a first wire and a second wire.

In an embodiment, the portion of the wire disposed in the first substrate may be exposed through operation S110. The first area of the first substrate where the exposed portion of the wire is located may be etched.

The exposed portion of the wire may extend in a first direction. In an embodiment, the wire connecting the at least one NAND flash memory and the memory controller to each other may include a plurality of wires connecting NAND flash memories to the memory controller. The exposed portion of the wire may include portions respectively corresponding to a plurality of exposed wires. Exposed wires of the wires may be apart from each other in a second direction.

The first area may be located between both ends of the exposed portion of the wire. The first area may extend in the second direction along centers of exposed wires of the wires. The second direction may cross the first direction. For example, the second direction may be perpendicular to the first direction.

The method of the embodiment may include cutting the wire by etching the first area of the first substrate. The wire may be divided by the cutting into a first wire and a second wire. The first wire may be connected to the at least one NAND flash memory. The second wire may be connected to the memory controller.

In operation S130 of the method of the embodiment, the first wire connected to the at least one NAND flash memory may be connected to a second substrate.

In an embodiment, the NAND flash memory device in which the wire is divided may be disposed on the second substrate. The NAND flash memory device in which the wire is divided may include a surface etched in operations S110 and S120 and a non-etched surface parallel to the etched surface. The NAND flash memory device in which the wire is divided may be disposed on an upper surface of the second substrate, and the upper surface of the second substrate may be in contact with the non-etched surface of the NAND flash memory device.

In an embodiment, an end of the first wire may be disposed on the etched surface of the NAND flash memory device. In the method of the embodiment, the end of the first wire and the second substrate may be connected to each other through another wire (a third wire).

For example, a pad may be brought into contact with the end of the first wire, and the pad and the second substrate may be connected to each other through the third wire. A metal layer may be disposed in the second substrate, solder balls may be arranged on a lower portion of the second substrate, and a main board may be finally connected to the second substrate. The at least one NAND flash memory may be electrically connected to the main board.

Figure 3:
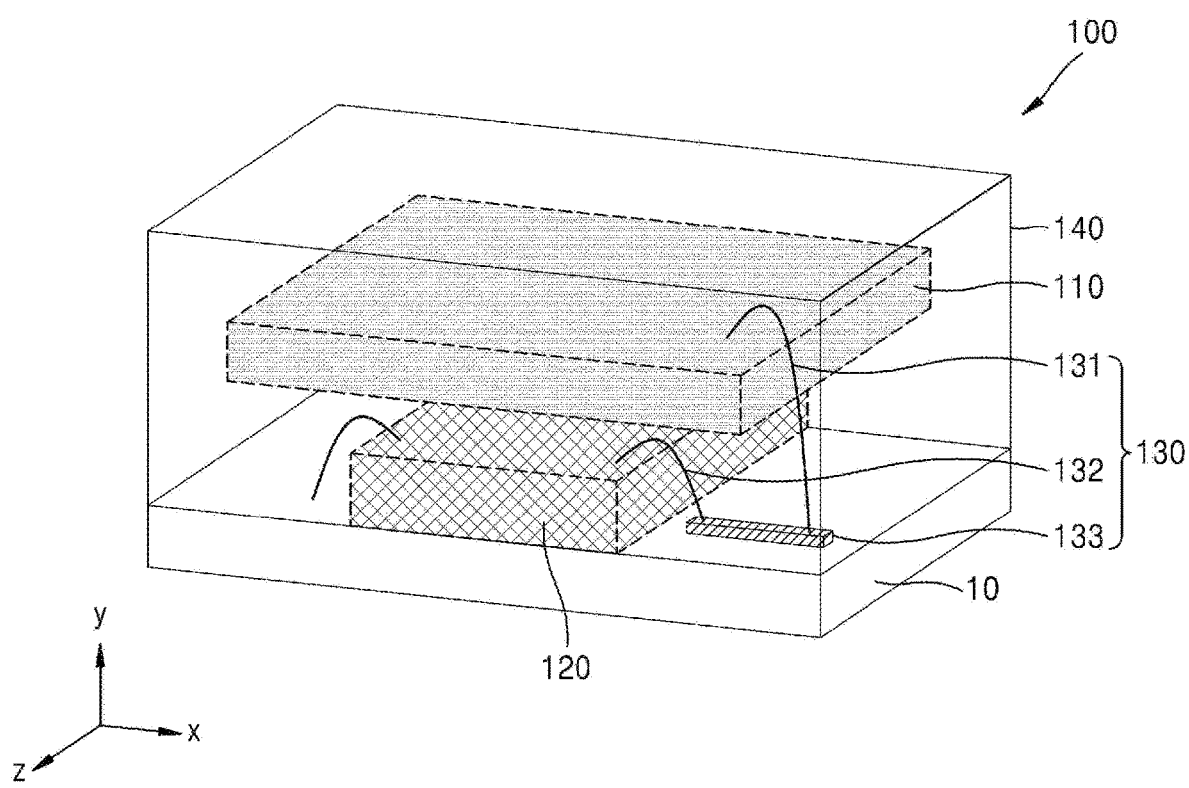
FIG. 3 is a view illustrating a NAND flash memory device to be processed according to an embodiment.

FIG. 3 is a view illustrating a NAND flash memory device 100 to be processed according to an embodiment.

For case of illustration, the same description as the description given with reference to FIG. 1 is simply presented or omitted here.

Referring to FIG. 3, the NAND flash memory device 100 may include a first substrate 10, at least one NAND flash memory 110, a memory controller 120, a wire 130, and a molding layer 140.

The first substrate 10 may be a bulk silicon substrate or a silicon-on-insulator (SOI) substrate. Alternatively, the first substrate 10 may be a silicon substrate or may include another material such as silicon germanium, silicon germanium on insulator (SGOI), indium antimonide, lead telluride, indium arsenide, indium phosphide, gallium arsenide, or gallium antimonide. However, the first substrate 10 is not limited thereto.

The memory controller 120 may be disposed on the first substrate 10, and the at least one NAND flash memory 110 may be disposed above the memory controller 120. However, the technical idea of the disclosure is not limited thereto. For example, the memory controller 120 and the at least one NAND flash memory 110 may be horizontally apart from each other. That is, the memory controller 120 and the at least one NAND flash memory 110 may be apart from each other in a first direction x.

The wire 130 may electrically connect the at least one NAND flash memory 110 and the memory controller 120 to each other. The wire 130 may be, for example, a metallic line. The wire 130 may include a first wire 131, a second wire 132, and a connection portion 133.

The first wire 131 may refer to a portion directly connected to the at least one NAND flash memory 110. The second wire 132 may refer to a portion directly connected to the memory controller 120. The first wire 131 and the second wire 132 may be disposed in the molding layer 140.

The connection portion 133 may refer to a portion connecting the first wire 131 and the second wire 132 to each other. The connection portion 133 may be disposed in the first substrate 10. The connection portion 133 may extend in the first direction x.

The molding layer 140 may be disposed on the first substrate 10. The molding layer 140 may cover the at least one NAND flash memory 110, the memory controller 120, and the wire 130 that are arranged above the first substrate 10.

The molding layer 140 may include, for example, an insulating material.

In an embodiment, although not shown in FIG. 3, the NAND flash memory device 100 may further include a metal layer and solder balls.

The metal layer may be disposed in the first substrate 10. The metal layer may penetrate the first substrate 10 and may be connected to the solder balls. The solder balls may be arranged on a lower portion of the first substrate 10. For example, the metal layer and the solder balls may include metallic materials that are electrically connected to each other.

Figure 4:
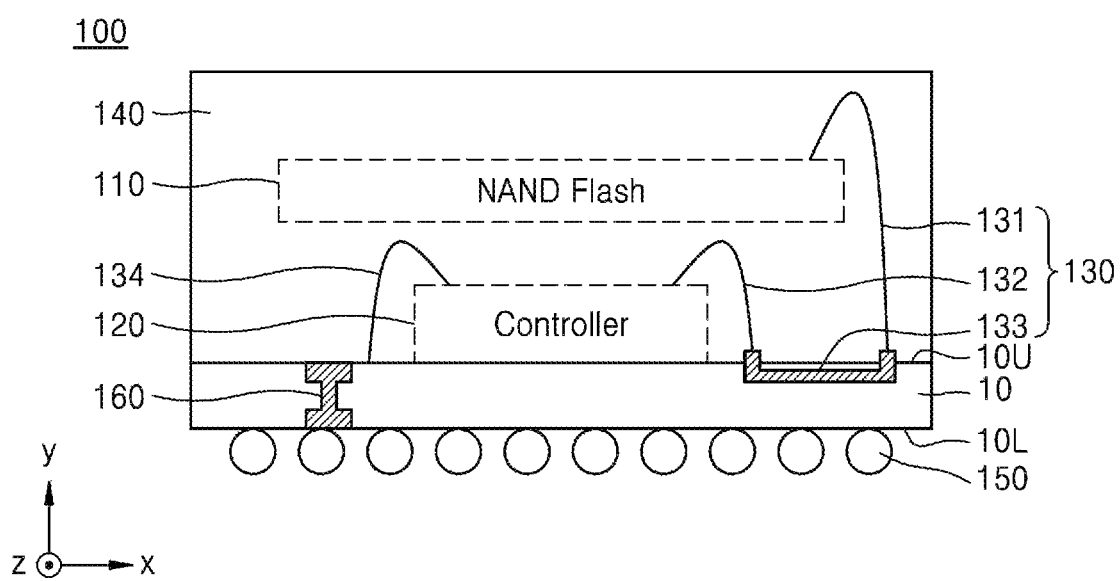
FIG. 4 is a view illustrating a NAND flash memory device that is to be processed by a NAND flash memory device processing method according to an embodiment.

FIG. 4 is a view illustrating a NAND flash memory device that is to be processed by a NAND flash memory device processing method according to an embodiment.

Figure 5:
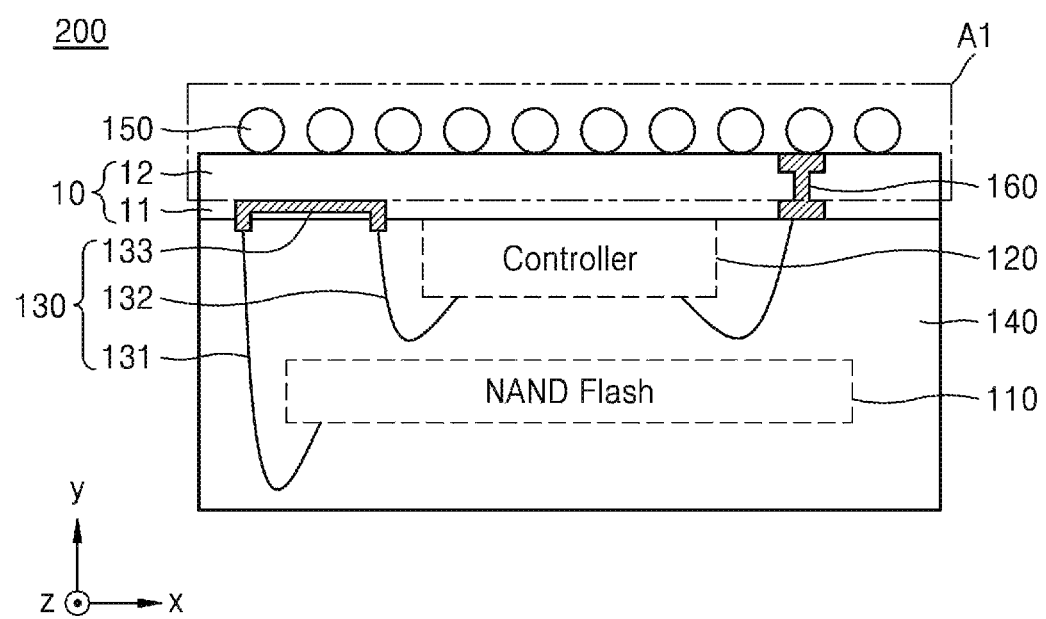
FIG. 5 is a view illustrating a method of processing a NAND flash memory device, according to an embodiment.
Figure 6:
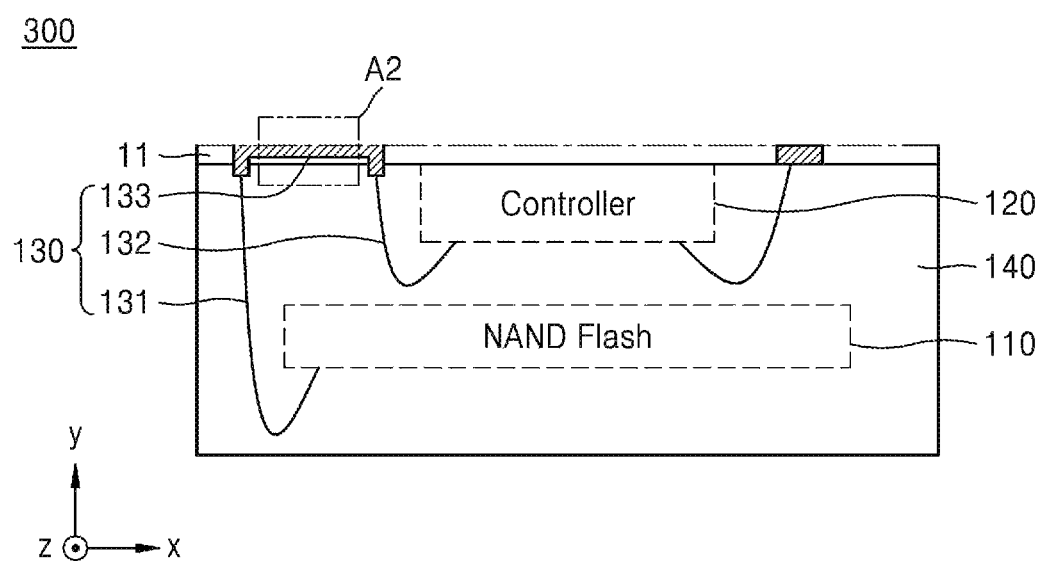
FIG. 6 is a view illustrating a method of processing a NAND flash memory device, according to an embodiment.
Figure 7:
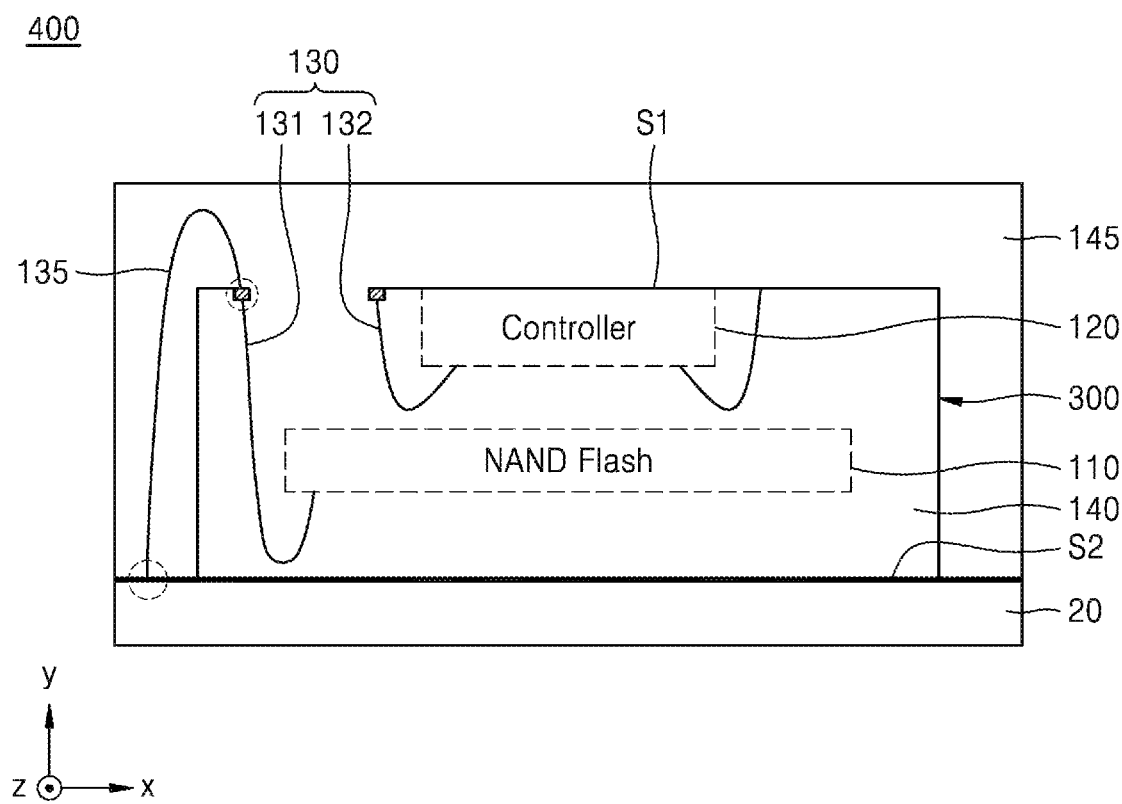
FIG. 7 is a view illustrating a method of processing a NAND flash memory device, according to an embodiment.

For reference, FIG. 4 is a cross-sectional view taken along a plane parallel to first and second directions to illustrate the NAND flash memory device 100 shown in FIG. 3. FIGS. 5 to 7 are views illustrating intermediate operations of the NAND flash memory device processing method based on FIG. 4.

Herein, in the intermediate operations illustrated in FIGS. 4 to 7, the NAND flash memory device is referred to as a first NAND flash memory device 100, a second NAND flash memory device 200, a third NAND flash memory device 300, and a fourth NAND flash memory device for distinguishment in the intermediate operations.

Referring to FIG. 4, the first NAND flash memory device 100 that is to be processed by the NAND flash memory device processing method of the embodiment may be provided. For ease of illustration, the same description as the description given with reference to FIG. 3 is simply presented or omitted here.

In an embodiment, the first NAND flash memory device 100 to be processed by the NAND flash memory device processing method may include a first substrate 10, at least one NAND flash memory 110, a memory controller 120, a wire 130, and a first molding layer 140.

The wire 130 may connect the at least one NAND flash memory 110 and the memory controller 120 to each other. The wire 130 may include a first wire 131, a second wire 132, and a connection portion 133. A portion of the wire 130 may be disposed in the first substrate 10. That is, the connection portion 133 may be disposed in the first substrate 10.

The connection portion 133 may be disposed in the first substrate 10 and may be adjacent to an upper surface 10U of the first substrate 10. When the connection portion 133 is exposed by etching the first substrate 10, a lower portion of the first substrate 10 including a lower surface 10L of the first substrate may be etched to ensure the exposure of the connection portion 133.

In an embodiment, the wire 130 may include an external connection wire 134 in addition to the first wire 131, the second wire 132, and the connection portion 133. The first wire 131, the second wire 132, and the connection portion 133 are electrically connected to each other and connect the at least one NAND flash memory 110 and the memory controller 120 to each other. The external connection wire 134 connects the memory controller 120 and the first substrate 10 to each other.

In an embodiment, the external connection wire 134 may be connected to a metal layer 160 disposed in the first substrate 10. For example, a connection pad may be disposed between the external connection wire 134 and the metal layer 160 to facilitate connection between the external connection wire 134 and the metal layer 160. The metal layer 160 and the connection pad may include, for example, a conductive metallic material.

The external connection wire 134 may be connected to a solder ball 150 through the metal layer 160. For example, an external host may be connected to the memory controller 120 through the external connection wire 134, the metal layer 160, and the solder ball 150.

FIG. 5 is a view illustrating a method of processing a NAND flash memory device according to an embodiment.

FIG. 5 illustrates the second NAND flash memory device 200 in an intermediate operation of the NAND flash memory device processing method.

In an embodiment, a portion 12 of the first substrate 10 of the second NAND flash memory device 200 may be etched. As shown in FIG. 5, a first area A1 may be etched. The first area A1 may include solder balls 150, the portion 12 of the first substrate 10, and a portion of the metal layer 160 included in the portion 12 of the first substrate 10.

For ease of illustration, the first substrate 10 may be described as including the portion 12 to be removed by etching and a rest portion 11. The portion 12 of the first substrate 10 may be removed through the etching process, and then, the rest portion 11 of the first substrate 11 may remain.

After the first area A1 is etched, the rest portion 11 of the first substrate 10 may remain. The connection portion 133 may be disposed in the rest portion 11 of the first substrate 10. The connection portion 133 may be exposed on the rest portion 11 of the first substrate 10.

For example, the etching process may include grinding the first substrate 10 through a surface polishing process. However, this is only an example and does not limit the technical idea of the disclosure.

FIG. 6 is a view illustrating a method of processing a NAND flash memory device according to an embodiment.

FIG. 6 illustrates the third NAND flash memory device 300 in an intermediate operation of the NAND flash memory device processing method.

In an embodiment, a second area A2 of the the rest portion 11 of the first substrate 10 may be etched. As shown in FIG. 6, the connection portion 133 may be divided by etching the second area A2. When the second area A2 is etched, the depth of etching does not limit the technical idea of the disclosure. The second area A2 may be etched to divide the connection portion 133.

A portion of the connection portion 133 is included in the second area A2 as shown in FIG. 6, and thus, the connection portion 133 may be divided by etching the second area A2. Whether or not the connection portion 133 remains may be determined depending on the width of the second area A2 to be etched. However, the technical idea of the disclosure is not limited thereto.

For example, as shown in FIG. 6, the second area A2 may include a portion of the connection portion 133, and the connection portion 133 may be divided by etching the second area A2. After the connection portion 133 is divided into two separate portions, the wire 130 may be divided into: the first wire 131 including one of the two separate portions of the connection portion 133; and the second wire 132 including the rest of the two separate portions of the connection portion 133. The first wire 131 may be a portion to which the at least one NAND flash memory 110 is connected. The second wire 132 may be a portion to which the memory controller 120 is connected.

In another example, the second area A2 may entirely include the connection portion 133, and the connection portion 133 may be removed by etching the second area A2. After the connection portion 133 is removed, the first wire 131 and the second wire 132 of the wire 130 may remain. After the second area A2 is etched, an end of the first wire 131 and an end of the second wire 132 may be exposed.

FIG. 7 is a view illustrating a method of processing a NAND flash memory device according to an embodiment.

FIG. 7 illustrates the fourth NAND flash memory device 400 in an intermediate operation of the NAND flash memory device processing method. For reference, FIG. 7 is a view illustrating a NAND flash memory device processed according to an embodiment.

In an embodiment, the first wire 131 to which the at least one NAND flash memory 110 is connected may be connected to a second substrate 20. The first wire 131 and the second substrate 20 may be connected through a third wire 135.

In an embodiment, the third NAND flash memory device 300 may be disposed on the second substrate 20. The fourth NAND flash memory device 400 may include the second substrate 20, the third NAND flash memory device 300, and a second molding layer 145.

The second substrate 20 may be a bulk silicon substrate or an SOI substrate. Alternatively, the second substrate 20 may be a silicon substrate or may include another material such as silicon germanium, SGOI, indium antimonide, lead telluride, indium arsenide, indium phosphide, gallium arsenide, or gallium antimonide. However, the second substrate 10 is not limited thereto.

In an embodiment, as the connection portion 133 (refer to FIG. 5) is divided or removed, the third NAND flash memory device 300 may include the first wire 131 and the second wire 132 that are separate from each other. The third NAND flash memory device 300 may include a first surface S1 and a second surface S2.

The first surface S1 may be a surface on which the end of the first wire 131 and the end of the second wire 132 are located. The end of the first wire 131 and the end of the second wire 132 may refer to both ends of the connection portion 133 (refer to FIG. 5) after the connection portion 133 is divided or removed. That is, as the connection portion 133 (refer to FIG. 5) located on the first surface S1 is removed (or divided), both remaining ends of the connection portion 133 (refer to FIG. 5) may respectively correspond to the end of the first wire 131 and the end of the second wire 132. The second surface S2 may be parallel to the first surface S1.

In an embodiment, the first wire 131 connected to the at least one NAND flash memory 110 may be connected to the second substrate 20 through the third wire 135.

In an embodiment, the third wire 135 may be connected to a metal layer disposed in the second substrate 20. For example, a connection pad may be disposed between the third wire 135 and the metal layer to facilitate connection between the third wire 135 and the metal layer. The metal layer and the connection pad may include, for example, a conductive metallic material.

The third wire 135 may be connected to the metal layer, then to a solder ball, and finally to a main board. For example, the main board and the at least one NAND flash memory 110 may be connected through the first wire 131, the third wire 135, the metal layer, and the solder ball.

In an embodiment, a remaining portion of the connection portion 133 (refer to FIG. 5) may function as a contact pad that assists the connection between the first wire 131 and the third wire 135. In another example, a separate contact pad may be formed to assist the connection between the first wire 131 and the third wire 135. When the separate contact pad is formed, the contact pad may be disposed on the first surface S1 of the third NAND flash memory device 300 and may be connected to the first wire 131. The third wire 135 may connect the contact pad disposed on the first surface S1 to the second substrate 20.

In an embodiment, the second molding layer 145 may be formed. The second molding layer 145 may be disposed on the second substrate 20. The second molding layer 145 may cover the third NAND flash memory device 300.

The second molding layer 145 may include, for example, an insulating material.

Figure 8:
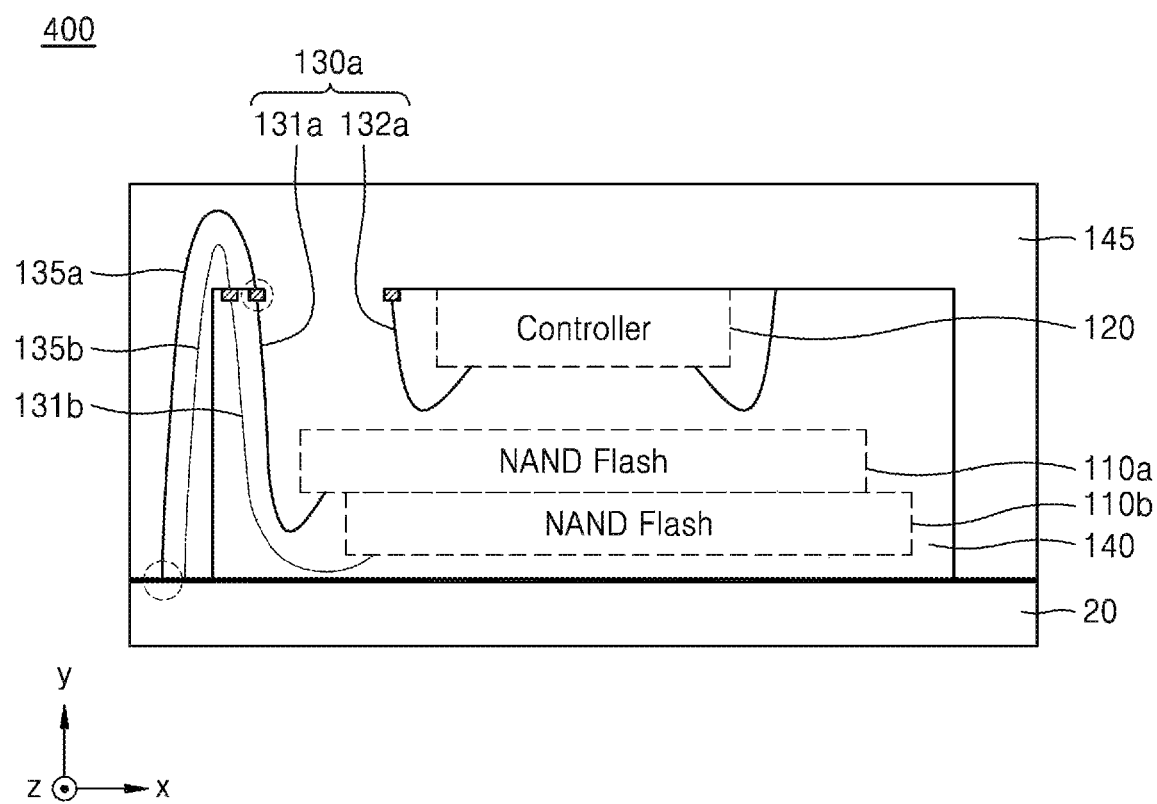
FIG. 8 is a view illustrating a NAND flash memory device processed according to an embodiment.

FIG. 8 is a view illustrating a NAND flash memory device processed according to an embodiment.

For ease of illustration, the same description as the description given with reference to FIG. 3 is simply presented or omitted here.

For reference, the at least one NAND flash memory 110 of the disclosure may refer to one NAND flash memory as shown in FIG. 7 or a plurality of NAND flash memories. A processed NAND flash memory device including a plurality of NAND flash memories 110 will now be described with reference to FIG. 8 based on an example in which the processed NAND flash memory device includes two NAND flash memories 110.

In an embodiment, the fourth NAND flash memory device 400 may include two or more NAND flash memories 110. For example, the fourth NAND flash memory device 400 may include a first NAND flash memory 110a and a second NAND flash memory 110b. The first NAND flash memory 110a and the second NAND flash memory 110b may be stacked in a second direction y. For example, the first and second NAND flash memories 110a and 110b may be stacked in a stepped shape to secure a wire connection space.

In an embodiment, the operations described with reference to FIGS. 5 to 7 may be equally applied to the first NAND flash memory 110a and the second NAND flash memory 110b. Because the operations are described with reference to FIGS. 5 to 7, the operations are simply described here.

Referring to FIGS. 4 and 8 together, for ease of illustration, only one wire 130 is shown, but the wire 130 may include a plurality of wires. For example, the wire 130 may include a wire connecting the first NAND flash memory 110a and the memory controller 120 to each other and a wire connecting the second NAND flash memory 110b and the memory controller 120 to each other. Each of the plurality of wires may connect one NAND flash memory and the memory controller 120 to each other.

Referring to FIGS. 5 and 8 together, in an embodiment, the portion 12 of the first substrate 10 may be etched to expose a plurality of connection portions. The first area A1 may be etched.

Referring to FIGS. 6 and 8 together, the second area A2 of the etched first substrate 10 may be etched. The connection portion 133 may be divided into a plurality of connection portions by etching the second area A2. The connection portion 133 may be divided into two separate portions, and thus, the wire 130 may be divided into the first wire 131 including one of the two separate portions of the connection portion 133 and the second wire 132 including the rest of the two separate portions of the connection portion 133.

For reference, there is a limit to illustrating, with reference to FIGS. 4 to 8, the dividing of the connection portion 133 into a plurality of separate portions by etching the second area A2. Thus, this is described again with reference to FIGS. 9 to 11.

Referring to FIG. 8, in an embodiment, first wires to which a plurality of NAND flash memories are connected may be connected to the second substrate 20. For example, a 1st_1 wire 131a to which the first NAND flash memory 110a is connected may be connected to the second substrate 20. In addition, a 1st_2 wire 131b to which the second NAND flash memory 110b is connected may be connected to the second substrate 20.

In an embodiment, the first wire 131 connected to the at least one NAND flash memory 110 may be connected to the second substrate 20 through the third wire 135. For example, the 1st_1 wire 131a connected to the first NAND flash memory 110a may be connected to the second substrate 20 through a 3rd_1 wire 135a. In addition, the 1st_2 wire 131b connected to the second NAND flash memory 110b may be connected to the second substrate 20 through a 3rd_2 wire 135b.

In an embodiment, the third wire 135 may be connected to a metal layer disposed in the second substrate 20. For example, a connection pad may be disposed between the third wire 135 and the metal layer to facilitate the connection between the third wire 135 and the metal layer. The metal layer and the connection pad may include, for example, a conductive metallic material.

Figure 9:
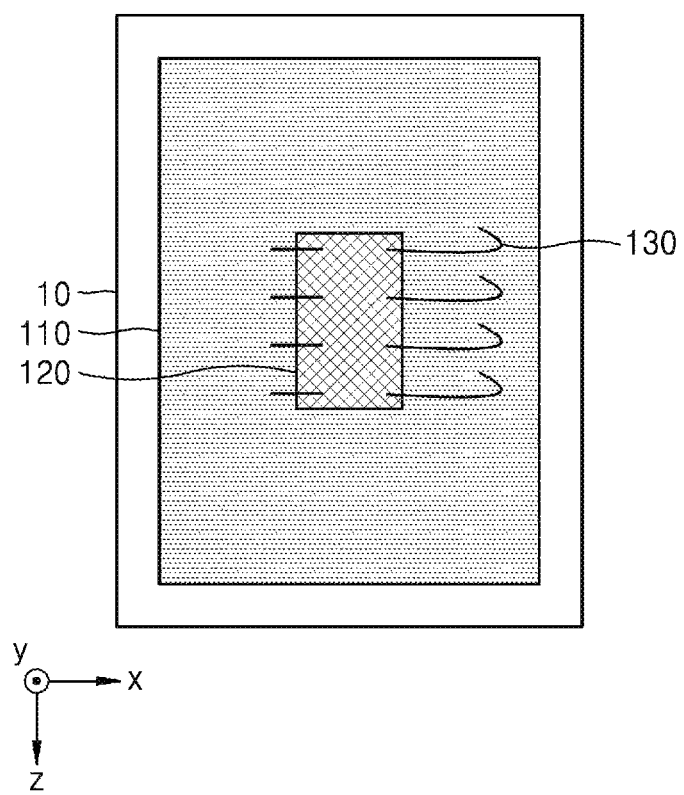
FIG. 9 is a view illustrating a method of processing a NAND flash memory device, according to an embodiment.
Figure 10:
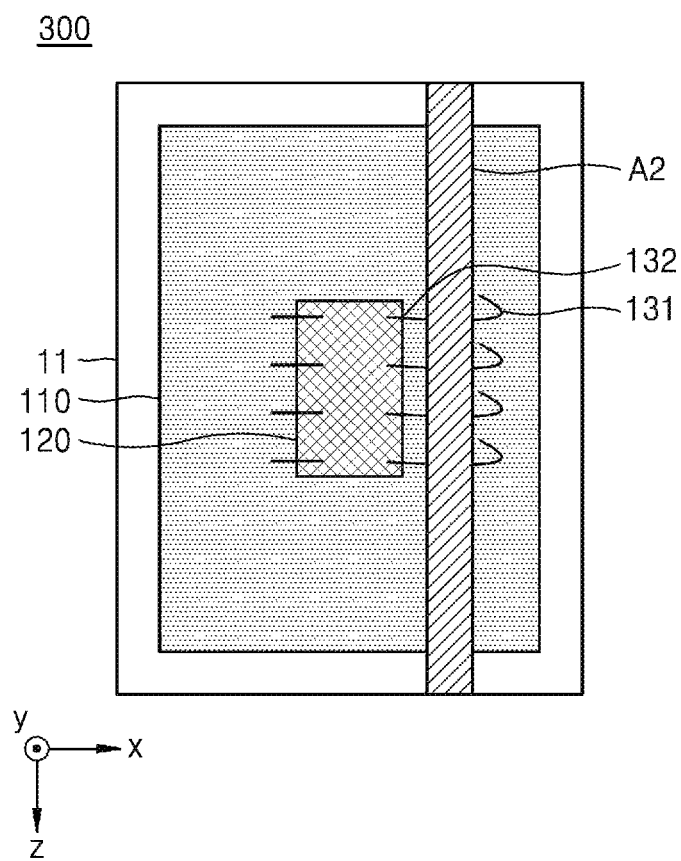
FIG. 10 is a view illustrating a method of processing a NAND flash memory device, according to an embodiment.
Figure 11:
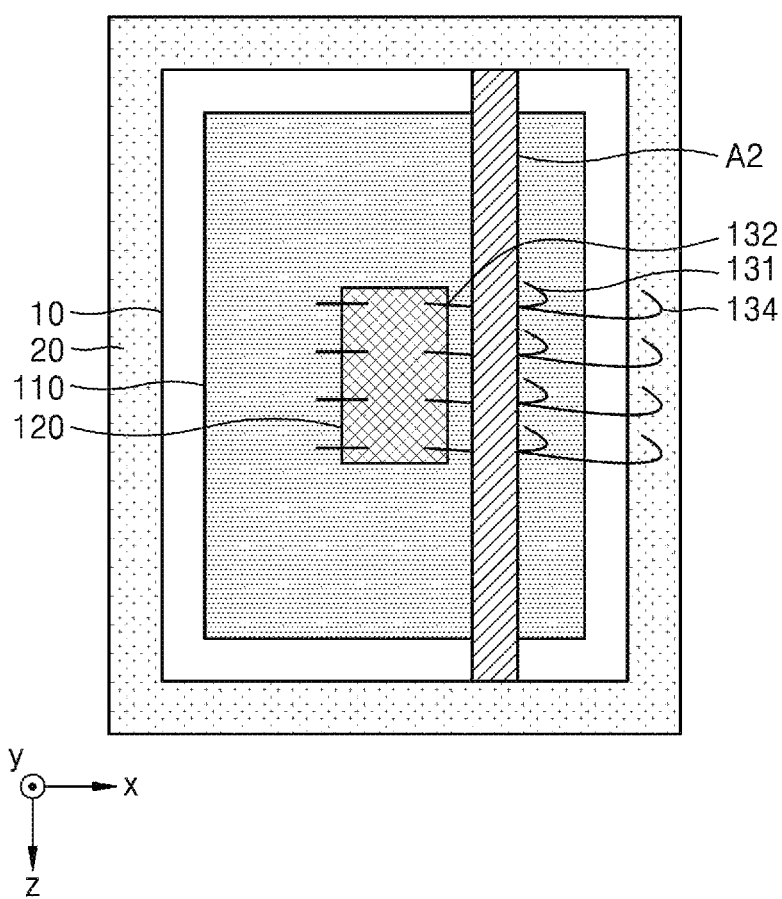
FIG. 11 is a view illustrating a method of processing a NAND flash memory device, according to an embodiment.

FIGS. 9 to 11 are views illustrating a method of processing a NAND flash memory device according to an embodiment. For reference, FIGS. 9 to 11 are plan views illustrating the NAND flash memory device in intermediate operations corresponding to FIGS. 5 to 7.

For ease of illustration, the same description as the description given with reference to FIGS. 4 to 7 is simply presented or omitted here.

FIG. 9 is a plan view illustrating a second NAND flash memory device 200 in an intermediate operation of the NAND flash memory device processing method.

In an embodiment, a portion of a first substrate 10 of the second NAND flash memory device 200 may be etched. As the portion of the first substrate 10 is etched, a portion of a wire 130 may be exposed on a rest portion 11 (refer to FIG. 5) of the first substrate 10. The shape and the etched area of the first substrate 10 are not shown in FIG. 9 because of the viewpoint of FIG. 9, but may be understood with reference to FIG. 5.

In an embodiment, the wire 130 connecting at least one NAND flash memory 110 and a memory controller 120 to each other may include a plurality of wires. For example, one of the plurality of wires may connect a first NAND flash memory and the memory controller 120, another of the plurality of wires may connect a second NAND flash memory and the memory controller 120 to each other, and another of the plurality of wires may connect a third NAND flash memory and the memory controller 120 to each other.

For example, the plurality of wires may be apart from each other in a third direction z. The third direction z may cross a first direction x and a second direction y. A portion of the wire 130 may extend in the first direction x. A connection portion 133 (refer to FIG. 5) of the wire 130 may extend in the first direction x.

FIG. 10 is a plan view illustrating a third NAND flash memory device 300 in an intermediate operation of the NAND flash memory device processing method.

In an embodiment, a second area A2 of the rest portion 11 of the first substrate 10 may be etched. As shown in FIG. 10, the wire 130 may be divided by etching the second area A2. The connection portion 133 (refer to FIG. 5) of the wire 130 is etched in the second area A2 such that the connection portion 133 of the wire 130 may be divided.

In an embodiment, the second area A2 may be located between ends of the wire 130. The second area A2 may extend in the third direction z. As the second area A2 is etched, the plurality of wires that extend in the first direction x may each be divided. Each of the plurality of divided wires may include a first wire 131 and a second wire 132.

FIG. 11 is a plan view illustrating a fourth NAND flash memory device 400 in an intermediate operation of the NAND flash memory device processing method.

In an embodiment, the first wire 131 to which the at least one NAND flash memory 110 is connected may be connected to a second substrate 20. The first wire 131 and the second substrate 20 may be connected through a third wire 135.

For example, the third wire 135 may be connected to a metal layer disposed in the second substrate 20. The third wire 135 may be connected to the metal layer, then to a solder ball, and finally to a main board. Therefore, the main board and the at least one NAND flash memory 110 may be connected to each other through the first wire 131, the third wire 135, the metal layer, and the solder ball.

After the NAND flash memory device processing method is performed according to an embodiment, the at least one NAND flash memory 110 included in the fourth NAND flash memory device 400 may be operated through direct control of an external host device without being controlled by the memory controller 120. Therefore, the at least one NAND flash memory 110 of the fourth NAND flash memory device 400 may be recycled.

To address the technical problems described above, an embodiment provides a method of processing a NAND flash memory device including at least one NAND flash memory and a memory controller configured to control the at least one NAND flash memory. The method may include etching a portion of a first substrate of the NAND flash memory device to expose a wire connecting the at least one NAND flash memory and the memory controller to each other. The method may include dividing the wire into a first wire and a second wire by etching a first area of the etched first substrate. The method may include connecting, to a second substrate, the first wire to which the at least one NAND flash memory is connected.

In an embodiment, the wire may include: a connection portion disposed in the first substrate; the first wire connecting the connection portion and the at least one NAND flash memory to each other; and the second wire connecting the connection portion and the memory controller to each other.

The etching of the portion of the first substrate may include etching the portion of the first substrate to expose the connection portion.

In an embodiment, the dividing of the wire into the first wire and the second wire may include removing at least a portion of the connection portion.

In an embodiment, the connection portion may extend in a first direction The first area may be located between both ends of the connection portion The first area may extend in a second direction crossing the first direction.

In an embodiment, the connecting of the first wire to the second substrate may include connecting the first wire and the second substrate to each other using a third wire. The connecting of the first wire to the second substrate may include forming a molding layer on the second substrate to cover the third wire and the at least one NAND flash memory.

In an embodiment, the NAND flash memory device including the divided wire may include a first surface on which both ends of the connection portion are located and a second surface parallel to the first surface. The connecting of the first wire and the second substrate to each other using the third wire may include disposing the NAND flash memory device including the divided wire on the second substrate. An upper surface of the second substrate may be in contact with the second surface The connecting of the first wire and the second substrate to each other using the third wire may include connecting a first end and the second substrate to each other using the third wire, the first end being one of both the ends of the connection portion located on the first surface and being connected to the at least one NAND flash memory.

In an embodiment, the at least one NAND flash memory may include a first NAND flash memory and a second NAND flash memory disposed on the first NAND flash memory. The wire connecting the at least one NAND flash memory and the memory controller to each other may include: a wire connecting the first NAND flash memory and the memory controller to each other; and a wire connecting the second NAND flash memory and the memory controller to each other. The dividing of the wire into the first wire and the second wire may include dividing the wire connecting the first NAND flash memory and the memory controller to each other. The dividing of the wire into the first wire and the second wire may include dividing the wire connecting the second NAND flash memory and the memory controller to each other.

To address the technical problems described above, an embodiment provides a method of processing a NAND flash memory device including a first substrate, at least one NAND flash memory, and a memory controller configured to control the at least one NAND flash memory. The method may include removing a connection between the at least one NAND flash memory and the memory controller. The method may include connecting the at least one NAND flash memory to a second substrate that is different from the first substrate.

In an embodiment, the NAND flash memory device may further include a wire through which the at least one NAND flash memory and the memory controller that are arranged on the first substrate are connected to each other A connection portion that is part of the wire may be disposed in the first substrate.

In an embodiment, the removing of the connection between the at least one NAND flash memory and the memory controller may include etching a portion of the first substrate to expose the connection portion. The removing of the connection between the at least one NAND flash memory and the memory controller may include cutting the connection portion by etching a first area of the first substrate.

In an embodiment, the wire including the cut connection portion may include a first wire connected to the at least one NAND flash memory and a second wire connected to the memory controller. The connecting of the at least one NAND flash memory to the second substrate may include connecting the first wire and the second substrate to each other using a third wire. The connecting of the at least one NAND flash memory to the second substrate may include forming a molding layer on the second substrate to cover the third wire and the at least one NAND flash memory.

In an embodiment, the NAND flash memory device including the cut connection portion may include a first surface on which both ends of the cut connection portion are located and a second surface parallel to the first surface The connecting of the first wire and the second substrate to each other using the third wire may include disposing the NAND flash memory device including the cut connection portion on the second substrate with an upper surface of the second substrate being in contact with the second surface The connecting of the first wire and the second substrate to each other using the third wire may include connecting a second end and the second substrate to each other using the third wire, the second end being one of both the ends of the cut connection portion located on the first surface and being connected to the at least one NAND flash memory.

In an embodiment, the connection portion may extend in a first direction. The first area may be located between both ends of the connection portion The first area may extend in a second direction crossing the first direction.

In an embodiment, the at least one NAND flash memory may be apart from the memory controller in a third direction crossing the first direction and the second direction.

In an embodiment, the at least one NAND flash memory may include a first NAND flash memory and a second NAND flash memory disposed on the first NAND flash memory. The wire connecting the at least one NAND flash memory and the memory controller to each other may include: a wire connecting the first NAND flash memory and the memory controller to each other; and a wire connecting the second NAND flash memory and the memory controller to each other. The cutting of the connection portion may include cutting a first connection portion connecting the first NAND flash memory and the memory controller to each other, and a second connection portion connecting the second NAND flash memory and the memory controller to each other.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of processing a NAND flash memory device comprising at least one NAND flash memory and a memory controller configured to control the at least one NAND flash memory, the method comprising:

etching a portion of a first substrate of the NAND flash memory device to expose a wire connecting the at least one NAND flash memory and the memory controller to each other;

dividing the wire into a first wire and a second wire by etching a first area of the etched first substrate; and connecting, to a second substrate, the first wire to which the at least one NAND flash memory is connected, wherein the wire comprises: a connection portion disposed in the first substrate; the first wire connecting the connection portion and the at least one NAND flash memory to each other, and the second wire connecting the connection portion and the memory controller to each other, wherein the etching of the portion of the first substrate comprises etching the portion of the first substrate to expose the connection portion.

2. The method of claim 1, wherein the dividing of the wire into the first wire and the second wire comprises removing at least a portion of the connection portion.

3. The method of claim 1, wherein the connection portion extends in a first direction, and the first area is located between both ends of the connection portion and extends in a second direction crossing the first direction.

4. The method of claim 1, wherein the connecting of the first wire to the second substrate comprises:

connecting the first wire and the second substrate to each other using a third wire; and forming a molding layer on the second substrate to cover the third wire and the at least one NAND flash memory.

5. The method of claim 4, wherein the NAND flash memory device comprising the divided wire comprises a first surface on which both ends of the connection portion are located and a second surface parallel to the first surface, the connecting of the first wire and the second substrate to each other using the third wire comprises:

disposing, on the second substrate, the NAND flash memory device comprising the divided wire, wherein an upper surface of the second substrate is in contact with the second surface; and connecting a first end and the second substrate to each other using the third wire, wherein the first end is one of the ends of the connection portion located on the first surface and is connected to the at least one NAND flash memory.

6. The method of claim 1, wherein the at least one NAND flash memory comprises a first NAND flash memory and a second NAND flash memory disposed on the first NAND flash memory, wherein the wire connecting the at least one NAND flash memory and the memory controller to each other comprises: a wire connecting the first NAND flash memory and the memory controller to each other; and a wire connecting the second NAND flash memory and the memory controller to each other, wherein the dividing of the wire into the first wire and the second wire comprises:

dividing the wire connecting the first NAND flash memory and the memory controller to each other; and dividing the wire connecting the second NAND flash memory and the memory controller to each other.

7. A method of processing a NAND flash memory device, wherein the NAND flash memory device comprises a first substrate, at least one NAND flash memory, and a memory controller configured to control the at least one NAND flash memory, the method comprising:

removing a connection between the at least one NAND flash memory and the memory controller; and connecting the at least one NAND flash memory to a second substrate that is different from the first substrate, wherein the NAND flash memory device further comprises a wire through which the at least one NAND flash memory and the memory controller that are arranged on the first substrate are connected to each other, and a connection portion that is part of the wire is disposed in the first substrate, wherein the removing of the connection between the at least one NAND flash memory and the memory controller comprises:

etching a portion of the first substrate to expose the connection portion; and cutting the connection portion by etching a first area of the first substrate, wherein the wire comprising the cut connection portion comprises: a first wire connected to the at least one NAND flash memory; and a second wire connected to the memory controller, and the connecting of the at least one NAND flash memory to the second substrate comprises:

connecting the first wire and the second substrate to each other using a third wire; and forming a molding layer on the second substrate to cover the third wire and the at least one NAND flash memory.

8. The method of claim 7, wherein the NAND flash memory device comprising the cut connection portion comprises a first surface on which both ends of the cut connection portion are located and a second surface parallel to the first surface, and the connecting of the first wire and the second substrate to each other using the third wire comprises:

disposing, on the second substrate, the NAND flash memory device comprising the cut connection portion, wherein an upper surface of the second substrate is in contact with the second surface; and connecting a second end and the second substrate to each other using the third wire, wherein the second end is one of the ends of the cut connection portion located on the first surface and is connected to the at least one NAND flash memory.

9. The method of claim 7, wherein the connection portion extends in a first direction, and the first area is located between both ends of the connection portion and extends in a second direction crossing the first direction.

10. The method of claim 9, wherein the at least one NAND flash memory is apart from the memory controller in a third direction crossing the first direction and the second direction.

11. The method of claim 7, wherein the at least one NAND flash memory comprises a first NAND flash memory and a second NAND flash memory disposed on the first NAND flash memory, wherein the wire connecting the at least one NAND flash memory and the memory controller to each other comprises: a wire connecting the first NAND flash memory and the memory controller to each other; and a wire connecting the second NAND flash memory and the memory controller to each other, wherein the cutting of the connection portion comprises cutting a first connection portion connecting the first NAND flash memory and the memory controller to each other, and a second connection portion connecting the second NAND flash memory and the memory controller to each other.

12. A method of processing a NAND flash memory device comprising at least one NAND flash memory and a memory controller configured to control the at least one NAND flash memory, the method comprising:
   etching a portion of a first substrate of the NAND flash memory device to expose a wire connecting the at least one NAND flash memory and the memory controller to each other;
   dividing the wire into a first wire and a second wire by etching a first area of the etched first substrate; and
   connecting, to a second substrate, the first wire to which the at least one NAND flash memory is connected,
   wherein the at least one NAND flash memory comprises a first NAND flash memory and a second NAND flash memory disposed on the first NAND flash memory,
   wherein the wire connecting the at least one NAND flash memory and the memory controller to each other comprises: a wire connecting the first NAND flash memory and the memory controller to each other; and a wire connecting the second NAND flash memory and the memory controller to each other,
   wherein the dividing of the wire into the first wire and the second wire comprises:
   dividing the wire connecting the first NAND flash memory and the memory controller to each other; and
   dividing the wire connecting the second NAND flash memory and the memory controller to each other.

* * * * *